United States Patent [19]

Pearce, Jr. et al.

[11] 4,066,325

[45] Jan. 3, 1978

[54] ELECTRICAL CONNECTOR FOR PRINTED CIRCUIT BOARD

[75] Inventors: Warren Pearce, Jr., Warren; Andrew Russo, Jr., Fowler, both of Ohio

[73] Assignee: General Motors Corporation, Detroit, Mich.

[21] Appl. No.: 732,925

[22] Filed: Oct. 15, 1976

[51] Int. Cl.[2] ...................... H01R 13/46; H01R 13/42; H05K 1/07

[52] U.S. Cl. .......................... 339/176 MP; 339/217 S

[58] Field of Search ........... 339/191 M, 192 R, 217 S, 339/176 M, 176 MP

[56] References Cited

U.S. PATENT DOCUMENTS

| | | | |
|---|---|---|---|
| 2,944,240 | 7/1960 | Barber | 339/191 M |
| 3,555,493 | 1/1971 | Baumanis | 339/176 MP |
| 3,663,930 | 5/1972 | Henschen et al. | 339/217 S |

FOREIGN PATENT DOCUMENTS

| | | | |
|---|---|---|---|
| 1,128,545 | 9/1968 | United Kingdom | 339/176 MP |

*Primary Examiner*—Roy Lake
*Assistant Examiner*—Neil Abrams
*Attorney, Agent, or Firm*—F. J. Fodale

[57] ABSTRACT

An electrical connector for a printed circuit board or the like comprises a connector body having two rows of longitudinal terminal receiving cavities respectively disposed on opposite sides of a lateral slot. Each cavity has a forward longitudinal opening and a forward side rib. A terminal having a U-shaped forward end piloted on the side rib is individually retained in each cavity. A resilient cantilevered tongue portion of the terminal extends rearwardly from the U-shaped forward end and is disposed in the lateral slot. The connector body also has two rearward lateral slots. Lock plates are longitudinally slid into each rear slot to a retained position whereat each lock plate prevents withdrawal of all of the terminals in one of the rows.

8 Claims, 6 Drawing Figures

ELECTRICAL CONNECTOR FOR PRINTED CIRCUIT BOARD

This invention relates generally to electrical connectors for printed circuit boards and the like and more specifically to electrical connectors comprising a connector body carrying a plurality of terminals each having a resilient tongue portion which projects into a lateral slot for making electrical contact with a printed circuit board or the like received therein.

Electrical connectors of the above noted type are disclosed for example in U.S. Pat. No. 3,243,761 granted Mar. 29, 1966 to Heinz Piorunneck for a "Contact Locking Connector," U.S. Pat. No. 3,646,504 granted Feb. 29, 1972 to Edwin O. Classon for an "Electrical Connector" and U.S. Pat. No. 3,808,589 granted Apr. 30, 1974 to Francois Robert Bonhomme for "Electrical Contact Makers and Connectors Fitted With Such Devices."

The object of this invention is to provide an improved electrical connector of the above noted type in which specially shaped terminals are inserted into complementary shaped cavities in the connector body to an assembled position whereat portions of the terminals provide extremely stable supports for the resilient tongue portions which engage the printed circuit board.

Another object is to provide an improved electrical connector of the above noted type in which the terminals have U-shaped portions at their forward ends which cooperate with side ribs in the terminal cavities of the connector body to help stabilize the terminals and properly position the resilient tongue portions which extend via longitudinal openings in the cavities into a lateral slot of the connector body to contact a printed circuit board or the like received therein.

Yet another object of the invention is to provide an improved electrical connector of the above noted type in which the terminals are individually retained in the cavities of the connector body by individual primary locks and a row of terminals are retained by a common secondary lock.

Still another object of the invention is to provide an improved electrical connector of the above noted type in which the secondary lock assures proper seating of the terminals thereby eliminating partially seated terminals.

Yet still another object of this invention is to provide an improved electrical connector of the above noted type which when adapted for contacting both sides of a printed circuit board has provisions for stiffening resilient tongue portions of the terminals as well as avoiding short circuits therebetween.

Figure 1:
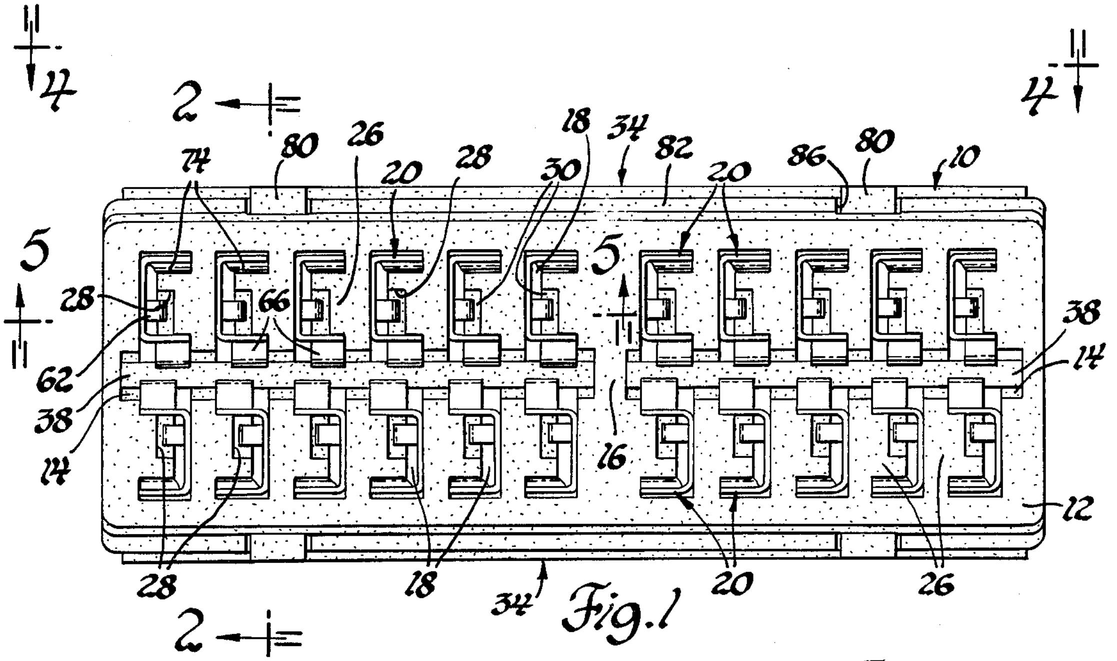
Figure 2:
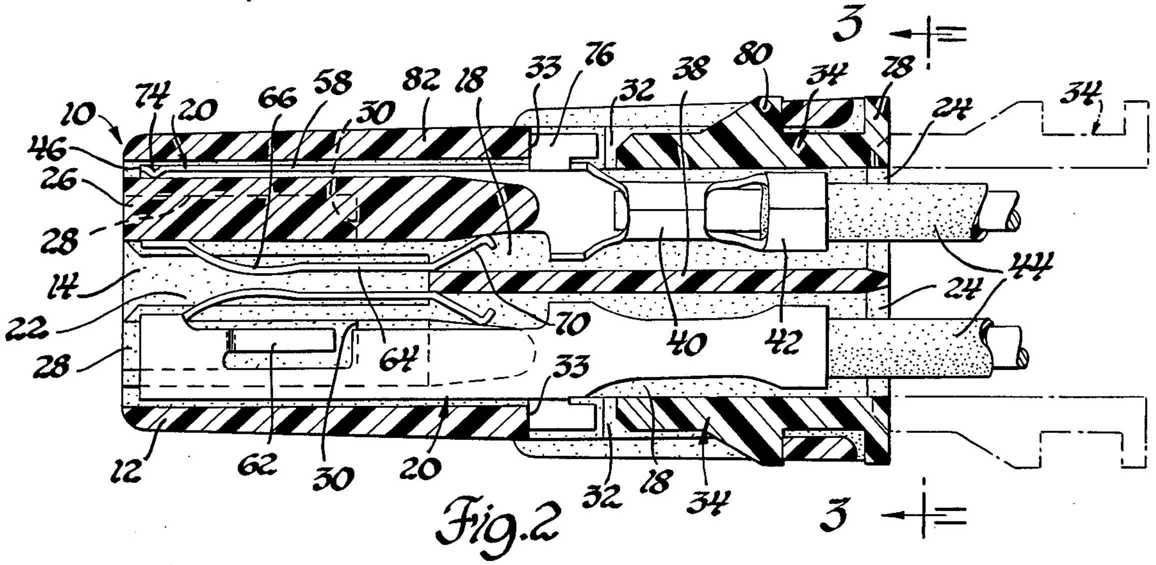
Figure 3:
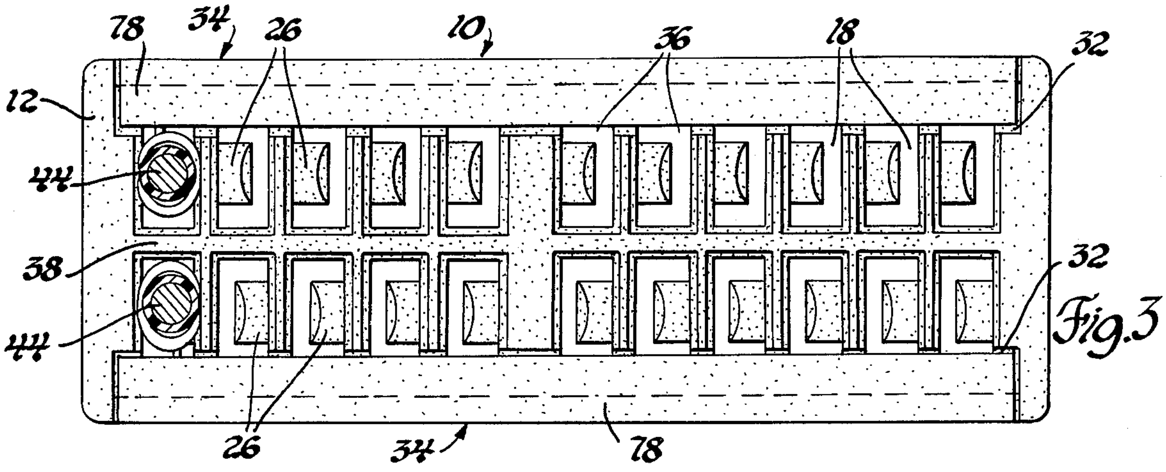
Figure 4:
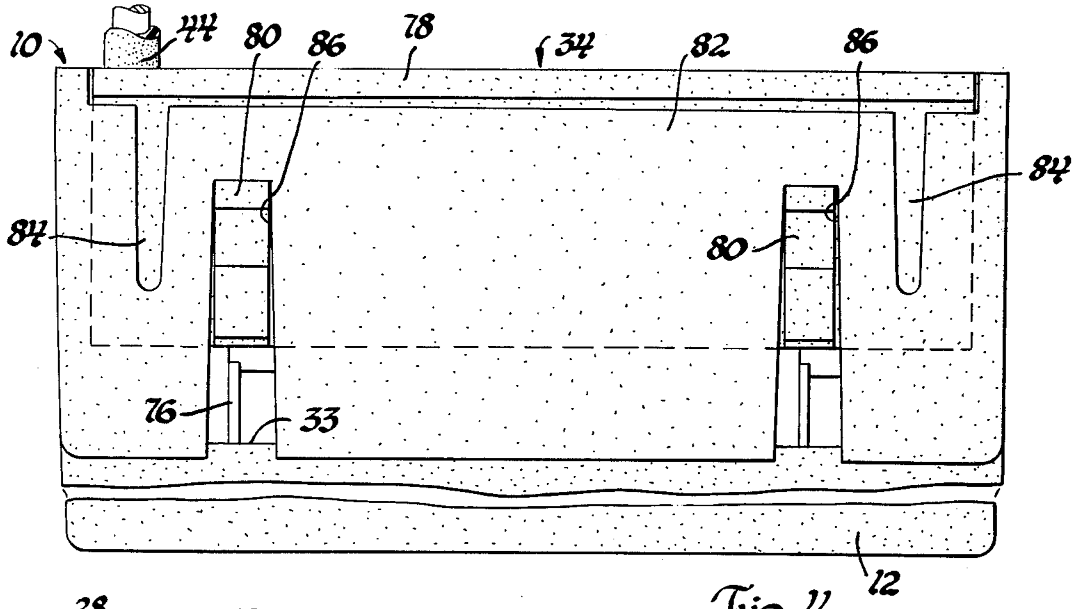
Figure 5:
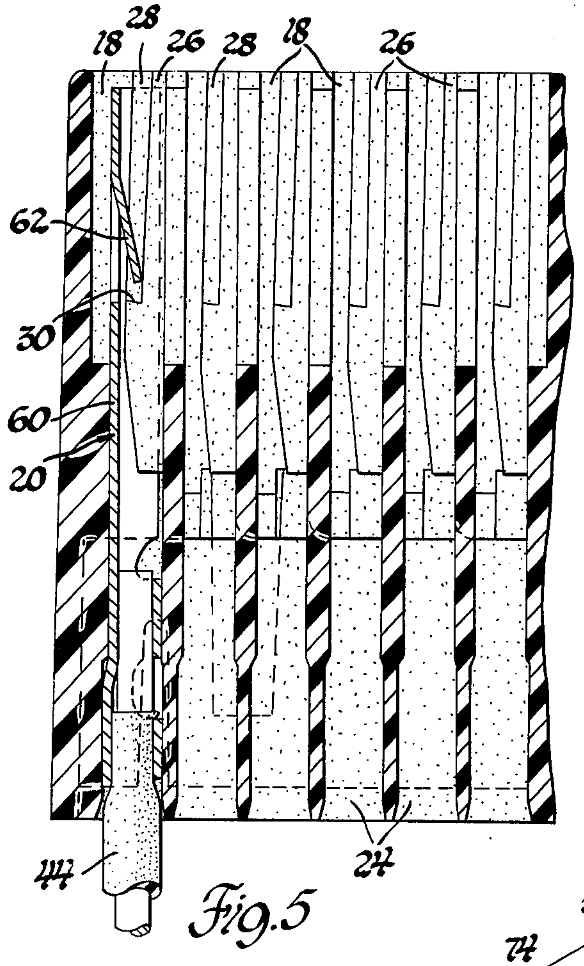
Figure 6:
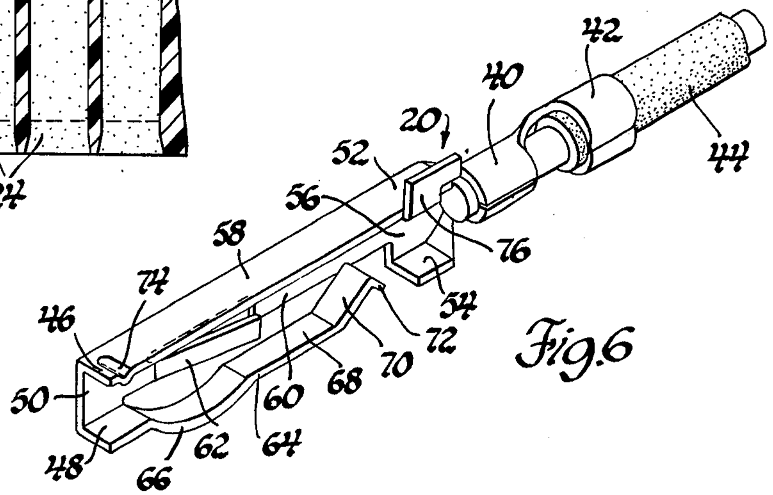

Other objects and features of the invention will become apparent to those skilled in the art as the disclosure is made in the following detailed description of a preferred embodiment of the invention as illustrated in the accompanying sheets of drawing in which:

FIG. 1 is a front view of an electrical connector for printed circuit boards or the like in accordance with this invention, FIG. 2 is a section taken along the line 2—2 of FIG. 1 looking in the direction of the arrows, FIG. 3 is a rear view of the electrical connector shown in FIGS. 1 and 2 along the line 3—3 of FIG. 2 with certain parts removed to illustrate internal detail, FIG. 4 is a top view of the electrical connector shown in FIG. 1 taken along the line 4—4 of FIG. 1, FIG. 5 is a section taken along the line 5—5 of FIG. 1 with certain parts removed to illustrate internal detail, and FIG. 6 is a perspective view of one of the terminals.

Referring now to the drawing there is shown an electrical connector 10 for printed circuit boards and the like (not shown). The electrical connector 10 comprises a connector body 12 of moldable synthetic insulating material such as nylon or polypropylene. At the forward end of the connector body 12 there is a lateral slot 14 which may include an offset central partition wall 16 for mating with a slot in the printed circuit board to properly orient the same. The connector body 12 has a plurality of longitudinal terminal receiving cavities 18 arranged in two rows on opposite sides of the lateral slot 14. The terminal receiving cavities 18 are all identical except that the cavities in one row are of opposite hand to the cavities in the other row so that identical terminals 20 may be used in both rows by reversing their orientation. Each of the cavities 18 have a forward longitudinal opening 22 by which the cavities 18 communicate with the lateral slot 14 and a rear lateral opening 24 by which the terminals 20 are inserted into the cavities. Each of the cavities 18 also have a forward side rib 26 which projects laterally into the cavity and is spaced from two walls of the cavity and the longitudinal opening 22 thereby giving the forward ends of the cavities a U-shaped cross section. The side ribs 26 have forward longitudinal slots 28 which provide forward facing latch shoulders 30 for cooperatively providing individual primary locks for the terminals 20. The rear ends of the side ribs 26 are preferably slightly tapered to assist assembly of the terminals.

The connector body 12 has an enlarged rear portion in which the cavities are also enlarged to provide rearward facing shoulders 33. The enlarged rear portion of the connector body 12 also has a pair of lateral slots 32 which are open at the rear end of the connector body for receiving secondary lock boards 34. One of the rear lateral slots 32 communicates with the cavities 18 in one row via longitudinal openings 36 opposite the common wall 38 separating the rows of cavities 18. The other lateral slot 32 is associated with the cavities 18 in the other row in the same manner.

Referring now to FIG. 6, the terminal 20 is of a unitary construction being stamped from a piece of sheet metal and bent to shape. The terminal 20 comprises a forward generally channel shaped portion and a conventional rearward ferrule portion comprising two sets of crimp wings 40 and 42 crimped respectively about the conductor core and insulation of a lead wire 44. The forward generally channel shaped portion comprises a U-shaped forward end portion having parallel legs 46 and 48 interconnected by an intermediate leg 50 and a U-shaped rearward end portion having parallel legs 52 and 54 interconnected by an intermediate leg 56. The legs 46 and 52 are coplanar with an interconnecting wall 58 while the legs 50 and 56 are coplanar with an interconnecting wall 60. The walls 58 and 60 are connected along one edge and orthogonally related. A latch tab 62 cut out of the wall 60 is attached at its forward end and bent to a protected position whereat its free end is spaced from the wall 60 in the lateral direction of the wall 58. The terminal 20 further comprises a resilient tongue portion 64 attached at its forward end to the leg 48. The tongue portion 64 has a forward curvilinear portion 66, an intermediate linear portion 68 generally parallel to the wall 58 and a rearward linear portion 70 which converges toward the wall 58 in the rearward direction and terminates in a diverging lip 72 at its free end. The leg 46 has a sizing dimple 74 and the leg 52 has a perpendicular tab 76 at its side edge remote from the leg 56.

The requisite number of terminals 20 individually attached to the requisite number of lead wires 44 are individually inserted into the cavities 18 through the rear openings 24 until the terminals are in the position shown in FIG. 2 where the U-shaped forward end portions are piloted on the ribs 26. The forward ends of the terminals are stabilized in the vertical direction by the distance between the leg 48 and the dimple in the leg 46. Lateral stabilization is provided by properly sizing the length of the legs 46 and 48 in the lateral direction.

The mid portion of the terminal 30 is similarly stabilized in the lateral direction by the legs 52 and 54. Stabilization in the vertical direction is provided by properly sizing the distance between the legs 52 and 54 with respect to the adjacent walls of the cavities. No side rib is necessary due to the presence of wall 38. The terminals 20 thus provide extremely stable support for the cantilevered resilient tongue portions 64 which project into the lateral slot 14 via the longitudinal openings 22. The linear portions 68 of the tongue portions 64 preferably engage the connector body wall 38 to prevent any opposed pair of terminals from contacting each other in the absence of the printed circuit board. The converging portions 70 of the tongue portions 64 also preferably engage the side ribs 26 to stiffen, that is, increase the spring rate of the cantilevered resilient tongue portions 64. As each terminal 20 is assembled, the latch tab 62 engages in the longitudinal slot 28 of the rib 26 and together with the shoulder 30 provides a primary lock for each individual terminal 20 preventing its withdrawal. Forward movement of the terminal 20 is limited by the tab 76 and the shoulder 33.

The terminals 20 are also provided with a common secondary lock for each row preventing withdrawal of the terminals in that one row. The secondary lock comprises a lock board 34 which slides into the rear slot 32 for disposition behind the tabs 76. The lock board 34 has a rear flange 78 for preventing overinsertion and a pair of laterally spaced lock ramps 80 to retain the lock board 34 in the locking position shown in FIG. 2.

As best seen in FIG. 4 the top wall 82 of the connector body has a pair of laterally spaced rear slots 84 to provide the rear portion of the top wall 82 with the requisite flexability for receiving the lock ramps 80 in the laterally spaced apertures 86. The bottom wall is configured in an identical manner.

During assembly of the secondary locks, the locking boards 34 engage the tabs 76 of any partially seated terminals and move such terminals to the fully seated position shown in FIG. 2.

We wish it to be understood that we do not desire to be limited to the exact details of construction shown and described, for obvious modifications will occur to a person skilled in the art.

We claim:

1. An electrical connector for a printed circuit board or the like comprising:
   - a connector body having a lateral slot at a forward end and a plurality of longitudinal terminal receiving cavities,
   - each of said cavities having a forward longitudinal opening through which said cavities communicate with said lateral slot, a rear opening and a central side rib protruding laterally into a forward portion thereof, and
   - a terminal disposed in each of said cavities,
   - said terminal being configured for insertion into its associated cavity via the rear opening thereof and comprising a U-shaped forward end portion having first and second parallel legs in piloting engagement with said side rib,
   - a rearward U-shaped portion having third and fourth parallel legs,
   - said U-shaped portions being connected to each other by interconnecting wall means, and
   - a resilient tongue portion connected to one of said first and second parallel legs of said U-shaped forward end portion and extending rearwardly in cantilever fashion with portions thereof disposed in said lateral slot.

2. An electrical connector for a printed circuit board or the like comprising:
   - a connector body having a lateral slot at a forward end and a plurality of longitudinal terminal receiving cavities,
   - each of said cavities having a forward longitudinal opening through which said cavities communicate with said lateral slot and a rearwardly facing shoulder,
   - a central side rib protruding laterally into a forward portion of each of said cavities and having a longitudinal slot providing a forwardly facing shoulder, and
   - a terminal disposed in each of said cavities,
   - said terminal comprising a U-shaped forward end portion having first and second parallel legs connected together by a first intermediate leg,
   - means spaced rearwardly of a forward end of said first leg, said means and said second leg being in piloting engagement with said side rib,
   - a rearward U-shaped portion having third and fourth parallel legs connected together by a second intermediate leg,
   - said U-shaped portions being connected to each other by orthogonal interconnecting walls one of which has a bent latch tab for engaging the forwardly facing shoulder of its associated side rib,
   - a resilient tongue portion connected to one of said first and second parallel legs of said U-shaped forward end portion and extending rearwardly in cantilever fashion with portions thereof disposed in said lateral slot, and
   - an upstanding tab at the free lateral edge of one of said third and fourth parallel legs for engaging said rearwardly facing shoulder.

3. A connector for a printed circuit board comprising:
   - a connector body having a lateral slot at a forward end and a plurality of longitudinal terminal receiving cavities arranged in a row parallel to said lateral slot, each of said cavities having a forward longitudinal opening through which said cavities communicate with said lateral slot, a rearwardly facing shoulder, a rear lateral opening for receiving a terminal and a central side rib protruding laterally into a forward portion thereof, said side rib having a forwardly facing shoulder, said connector body further having a second lateral slot at the rearward end thereof which lateral slot intersects each of said cavities in said row and is aligned with the rearwardly facing shoulder thereof, and a terminal disposed in each of said cavities, said terminal comprising a U-shaped forward end portion having first and second parallel legs connected together by an intermediate leg, means spaced rearwardly of a forward end of said first leg, said means and said second leg being in piloting engagement with said side rib, a rearward U-shaped portion having third and fourth parallel legs disposed rearwardly of said forward longitudinal opening and connected together by a second intermediate leg, said U-shaped portions being connected to each other by orthogonal interconnecting walls, one of which connects said intermediate legs and has a cut-out tab for engaging the forwardly facing shoulder of its associated rib, said terminal further comprising a resilient tongue portion connected to one of said parallel legs of said U-shaped forward end portion and extending rearwardly therefrom in cantilever fashion in spaced relation to the other of said orthogonal interconnecting walls with portions thereof disposed in said lateral slot, and an upstanding tab at a free end of one of said parallel legs of said rearward U-shaped portion for engaging said rearwardly facing shoulder, and a lock plate retained in said second lateral slot behind said tabs for providing a secondary lock preventing withdrawal of all of the terminals in said cavities via their respective rear lateral openings.

4. A connector for a printed circuit board comprising:

a connector body having a lateral slot at a forward end and a plurality of longitudinal terminal receiving cavities arranged in two rows parallel to and on opposite sides of said lateral slot, each of said cavities having a forward longitudinal opening extending to a longitudinal wall between said rows and through which said cavities communicate with said lateral slot, a rear lateral opening for receiving a terminal and a central side rib protruding laterally into a forward portion thereof, said connector body further having a pair of lateral slots at the rearward end thereof respectively associated with the two rows of cavities, a terminal disposed in each cavity, said terminal comprising a U-shaped forward end portion having first and second parallel legs, dimple means spaced rearwardly of a forward end of said first leg, said dimple means and said second leg being in piloting engagement with said side rib, and a rearward U-shaped portion having third and fourth parallel legs disposed rearwardly of said forward longitudinal opening, said U-shaped portions being connected to each other by orthogonal interconnecting walls, one of which has a cut-out tab for engaging a forwardly facing shoulder of its associated rib, to provide a primary lock preventing withdrawal of the terminal through the rear opening, said terminal further comprising a resilient tongue portion connected to one of said parallel legs of said U-shaped forward end portion and extending rearwardly therefrom in cantilever fashion with forward portions thereof disposed in said lateral slot and rearward portions thereof engaging said longitudinal wall and said side rib, and a pair of lock plates respectively disposed in said second pair of lateral slots for providing secondary locks preventing withdrawal of all the terminals in said cavities via their respective rear openings.

5. The connector defined in claim 1 wherein the resilient tongue portion of the terminal has a rearward portion which converges toward the interconnecting wall means and engages the side rib.

6. An electrical connector for a printed circuit board or the like comprising:

a connector body having a lateral slot at a forward end and a plurality of longitudinal terminal receiving cavities, each of said cavities having a forward longitudinal opening through which said cavities communicate with said lateral slot, a rear opening and a central side rib protruding laterally into a forward portion thereof, and a terminal disposed in each of said cavities, said terminal being configured for insertion into its associated cavity via the rear opening thereof comprising a U-shaped forward end portion having first and second parallel legs, dimple means spaced rearwardly of a forward end of said first leg, said dimple means and said second leg being in piloting engagement with said side rib, a rearward U-shaped portion having third and fourth parallel legs, said U-shaped portions being connected to each other by interconnecting wall means, and a resilient tongue portion connected to one of said first and second parallel legs of said U-shaped forward end portion and extending rearwardly in cantilever fashion with portions thereof disposed in said lateral slot.

7. The connector as defined in claim 6 wherein said dimple means comprises a dimple formed in said first leg.

8. The connector as defined in claim 6 wherein said resilient tongue portion is connected to said second leg.

* * * * *

UNITED STATES PATENT OFFICE
CERTIFICATE OF CORRECTION

Patent No. 4,066,325 Dated January 3, 1978

Inventor(s) Warren Pearce, Jr. and Andrew Russo, Jr.

It is certified that error appears in the above-identified patent and that said Letters Patent are hereby corrected as shown below:

Column 1, line 14, "Connector," should read -- Connector", --;

Column 1, line 17, "Electrical" should read -- Electric --.

Signed and Sealed this

*Twenty-fifth* Day of *April 1978*

[SEAL]

*Attest:*

RUTH C. MASON
*Attesting Officer*

LUTRELLE F. PARKER
*Acting Commissioner of Patents and Trademarks*